United States Patent
Molla et al.

(10) Patent No.: US 10,431,449 B2
(45) Date of Patent: Oct. 1, 2019

(54) MICROELECTRONIC SYSTEMS CONTAINING EMBEDDED HEAT DISSIPATION STRUCTURES AND METHODS FOR THE FABRICATION THEREOF

(71) Applicant: NXP USA, INC., Austin, TX (US)

(72) Inventors: Jaynal A. Molla, Gilbert, AZ (US); Lakshminarayan Viswanathan, Phoenix, AZ (US); Geoffrey Tucker, Tempe, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/182,325

(22) Filed: Nov. 6, 2018

(65) Prior Publication Data

US 2019/0148138 A1    May 16, 2019

Related U.S. Application Data

(62) Division of application No. 15/811,298, filed on Nov. 13, 2017, now Pat. No. 10,141,182.

(51) Int. Cl.

| | |
|---|---|
| *H01L 21/02* | (2006.01) |
| *H01L 23/40* | (2006.01) |
| *H01L 23/36* | (2006.01) |
| *H01L 23/367* | (2006.01) |
| *H01L 23/427* | (2006.01) |
| *H01L 21/60* | (2006.01) |

(52) U.S. Cl.
CPC .. *H01L 21/02109* (2013.01); *H01L 21/02304* (2013.01); *H01L 21/02697* (2013.01); *H01L 23/36* (2013.01); *H01L 23/3677* (2013.01); *H01L 23/40* (2013.01); *H01L 23/427* (2013.01); *H01L 2021/6027* (2013.01)

(58) Field of Classification Search
CPC .................. H01L 23/40; H01L 2021/6027
See application file for complete search history.

(56) References Cited

U.S. PATENT DOCUMENTS

2002/0167084 A1* 11/2002 Coccioli ............. H01L 23/3677
                                                        257/732

OTHER PUBLICATIONS

"Taiyo PSR-4000 AUS5 Technical Data Sheet" retrieved on Apr. 23, 2019 from http://taiyo-america.com/docs/files/7913/8178/8592/TDS_PSR-4000_AUS5_October_2013.pdf.*

* cited by examiner

*Primary Examiner* — Jay C Chang
*Assistant Examiner* — Mikka Liu

(57) ABSTRACT

Microelectronic systems having embedded heat dissipation structures are disclosed, as are methods for fabricating such microelectronic systems. In various embodiments, the method includes the steps or processes of obtaining a substrate having a tunnel formed therethrough, attaching a microelectronic component to a frontside of the substrate at a location covering the tunnel, and producing an embedded heat dissipation structure at least partially within the tunnel after attaching the microelectronic component to the substrate. The step of producing may include application of a bond layer precursor material into the tunnel and onto the microelectronic component from a backside of the substrate. The bond layer precursor material may then be subjected to sintering process or otherwise cured to form a thermally-conductive component bond layer in contact with the microelectronic component.

20 Claims, 8 Drawing Sheets

MICROELECTRONIC SYSTEMS CONTAINING EMBEDDED HEAT DISSIPATION STRUCTURES AND METHODS FOR THE FABRICATION THEREOF

CROSS-REFERENCE TO RELATED APPLICATION

This application is a divisional of U.S. application Ser. No. 15/811,298, filed with the United States Patent and Trademark Office (USPTO) on Nov. 13, 2017, the contents of which are incorporated by reference.

TECHNICAL FIELD

Embodiments of the present invention relate generally to microelectronic systems and, more particularly, to microelectronic systems containing embedded heat dissipation structures and methods for the fabrication thereof.

ABBREVIATIONS

Abbreviations appearing less frequently in this document are defined upon initial usage, while abbreviations appearing with greater frequency are defined below.
Ag—Silver;
Al—Aluminum;
Au—Gold;
CTE—Coefficient of Thermal Expansion;
Cu—Copper;
IC—Integrated Circuit;
MIMO—Multiple Input, Multiple Output (antenna structure);
PAM—Power Amplification Module;
PCB—Printed Circuit Board;
RF—Radio Frequency;
Wt %—Weight percent; and
° C.—degrees Celsius.

BACKGROUND

Microelectronic systems commonly contain power devices prone to the generation of excess heat during operation, particularly when operated at higher power levels and, perhaps, when operated at higher RF frequencies. In the absence of adequate heat dissipation means for removing excess heat from the system, undesirably elevated temperatures or "hot spots" can occur at localized regions within the microelectronic system and the power device(s) contained therein. Such highly elevated localized temperatures can detract from device performance and reliability, as well as degraded the overall reliability of the microelectronic system by accelerating common failure modes, such as solder joint fatigue. For this reason, microelectronic systems containing power devices, such packaged or unpackaged RF semiconductor die, are often fabricated utilizing embedded coined substrates; that is, substrates incorporating metal (e.g., Cu) slugs or "coins" having relatively high thermal conductivities. By attaching a power device or a module containing one or more power device(s) to an embedded coin, excess heat concentrations may be more effectively dissipated to enhance the thermal performance of the microelectronic system.

While generally having improved heat dissipation capabilities, microelectronic systems fabricated utilizing embedded coin substrates remain limited in multiple regards. The manufacturing processes utilized to fabricate coined substrates tend to be undesirably complex, costly, and may involve exposure to highly elevated processing temperatures at which substrate warpage and other deleterious effects can occur. Manufacturing cost and complexity may further increase when utilizing an embedded coin for electrical interconnection purposes; e.g., to electrically couple a ground pad of a power device or device-containing component, such as a PAM package, to a ground layer contained within a substrate. For example, in one known manufacturing approach, a multilayer PCB is produced to include at least one upper PCB layer composed of a higher quality dielectric material, as well as one or more lower PCB layers composed of a lower cost dielectric material, such as FR4. The PCB further contains an embedded coin and a ring-shaped cluster of vias or "via farm," which extends through the upper PCB layers to connect the embedded coin to electrical ground. Fabricating an embedded coin substrate in this manner can reduce PCB manufacturing costs, while enhancing the dielectric performance of the upper PCB laminates; however, embedded coin PCBs of this type do little to improve the overall heat dissipation capabilities of the resultant microelectronic system.

Even when setting aside the manufacturing-related limitations described above, microelectronic systems fabricated utilizing embedded coin substrates remain limited in other respects, as well. As conventionally designed and fabricated, such systems often rely upon legacy materials, such as solder materials, to attach heat-generating microelectronic components to the upper surfaces of coins embedded within a particular PCB or substrate. While suitable for many applications, the thermal conductivities and temperature tolerances of such materials can be undesirably restrictive in the context of high power and high frequency (e.g., RF) applications. As a result, the integration of conventional embedded coined substrates into microelectronic systems containing power devices often provides an incomplete or suboptimal heat dissipation solution. Consequently, highly elevated local temperatures may still occur at certain junctures within the thermal stack (that is, the various layers of materials through which conductive heat flow is desired) in a manner exacerbating failure modes of the microelectronic system when operated at higher power levels and/or at higher (e.g., RF) frequencies.

BRIEF DESCRIPTION OF THE DRAWINGS

At least one example of the present invention will hereinafter be described in conjunction with the following figures, wherein like numerals denote like elements, and.

Figure 1:
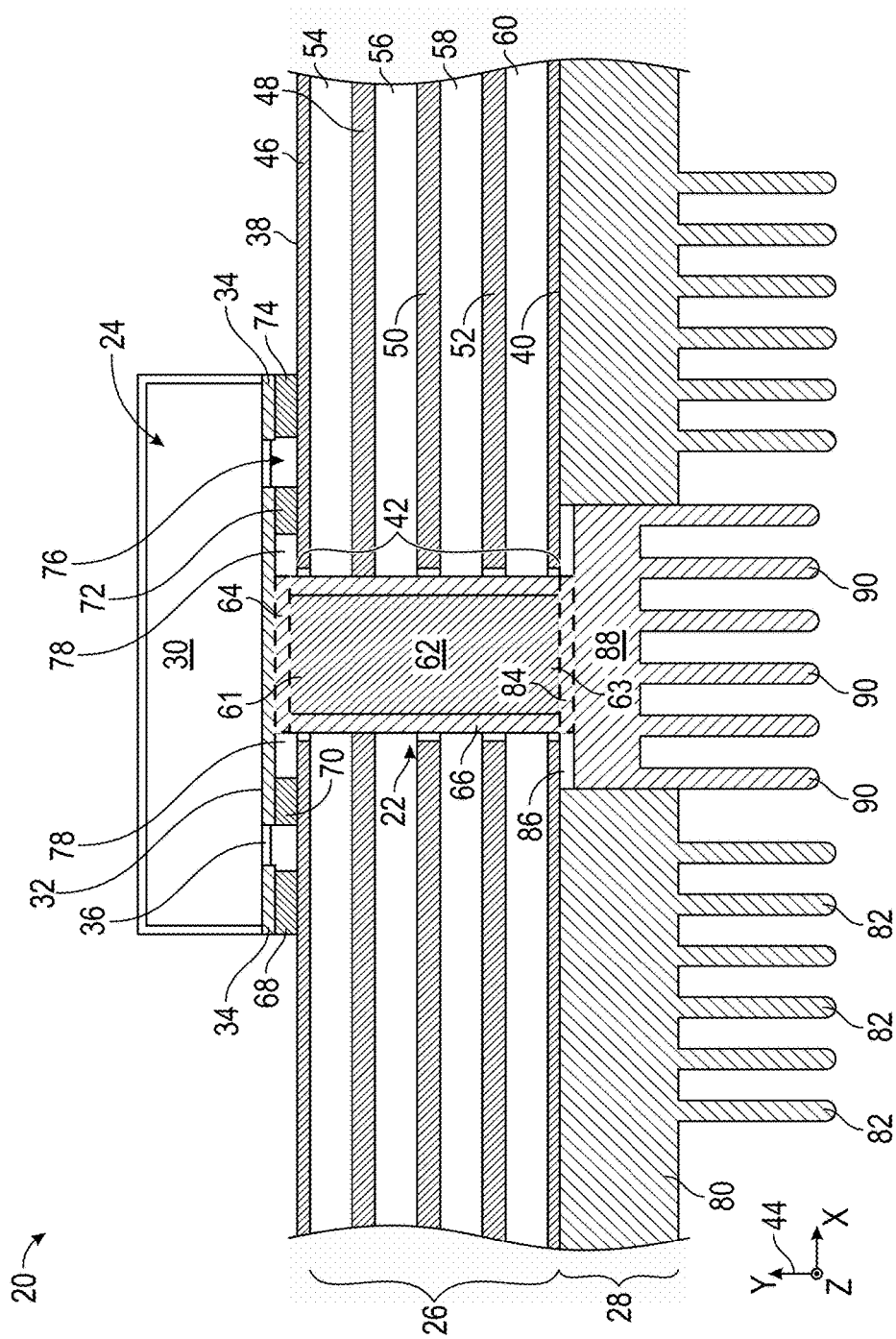
FIG. 1 is cross-sectional view of a microelectronic system including a heat-generating microelectronic component attached to substrate in which an embedded heat dissipation structure is formed, as illustrated in accordance with an exemplary embodiment of the present disclosure.

For simplicity and clarity of illustration, descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. The term "exemplary," as appearing throughout this document, is synonymous with the term "example" and is utilized repeatedly below to emphasize that the following description provides only multiple non-limiting examples of the invention and should not be construed to restrict the scope of the invention, as set-out in the Claims, in any respect. As appearing herein, a structure, body, material, or layer is considered "thermally-conductive" when the structure, body, material, or layer has a thermal conductivity exceeding 5 watts per meter-Kelvin (W/mK).

Applications Incorporated by Reference

The following applications, which are owned by the present assignee at the time of filing this document with the United States Patent and Trademark Office (USPTO), generally relate to the present subject matter to varying degrees, and are hereby incorporated by reference: U.S. patent application Ser. No. 15/223,307, filed with the USPTO on Jul. 29, 2016, and entitled "SINTERED MULTILAYER HEATSINKS FOR MICROELECTRONIC PACKAGES AND METHODS FOR THE PRODUCTION THEREOF"; U.S. patent application Ser. No. 15/269,629, filed with the USPTO on Sep. 19, 2016, and entitled "AIR CAVITY PACKAGES AND METHODS FOR THE PRODUCTION THEREOF"; U.S. patent application Ser. No. 15/363,671, filed with the USPTO on Nov. 29, 2016, and entitled "MICROELECTRONIC MODULES WITH SINTER-BONDED HEAT DISSIPATION STRUCTURES AND METHODS FOR THE FABRICATION THEREOF"; and U.S. patent application Ser. No. 15/670,429, filed with the USPTO on Aug. 7, 2017, and entitled "MOLDED AIR CAVITY PACKAGES AND METHODS FOR THE PRODUCTION THEREOF."

Overview

Microelectronic systems having embedded heat dissipation structures are disclosed, as are methods for manufacturing such microelectronic systems. As indicated by the term "embedded," the heat dissipation structures occupy or substantially fill tunnels, apertures, or through-holes formed through substrates, such as multilayer PCBs, which support heat-generating microelectronic components. In various implementations, an embedded heat dissipation structure may be wholly or at least largely contained within a given tunnel provided through a PCB or other substrate. This is not strictly necessary, however, and embodiments in which the embedded heat dissipation structure extends or projects beyond the substrate (particularly the substrate backside) are equally viable and contemplated. Thus, as appearing herein, the term "embedded" indicates that at least a portion of the heat dissipation structures is formed within a tunnel extending through a substrate.

At least one heat-generating microelectronic component is attached to the substrate and placed in thermal communication with the embedded heat dissipation structure. The heat-generating microelectronic component can be an unpackaged microelectronic device, such as a bare semiconductor die, prone to the generation of excess heat. Alternatively, the heat-generating microelectronic component can be a microelectronic package or module, which contains one or more microelectronic devices, such as power (e.g., RF) semiconductor die, susceptible to excess heat generation under certain operational conditions. In various embodiments of the microelectronic system, the embedded heat dissipation structure is further leveraged for electrical interconnection purposes; that is, utilized to electrically couple one or more terminals of a heat-generating microelectronic component to other electrically-active features, devices, or structures present within the microelectronic system. In the context of RF applications, for example, the embedded heat dissipation structure may be leveraged to provide a relatively direct, low resistance electrical interconnection between a ground pad of a heat-generating microelectronic component, such as a PAM package, and a ground layer contained within a multilayer PCB or other substrate to which the microelectronic component is mounted. This notwithstanding, the embedded heat dissipation structure need not be leveraged for electrical interconnection purposes in all embodiments, and may instead be utilized exclusively for heat dissipation purposes in other implementations of the microelectronic system.

The embedded heat dissipation structure usefully contains at least one thermally-conductive component bond layer; that is, a layer composed of a thermally-conductive material and bonded to a region (e.g., surface, terminal, or heatsink) of the microelectronic component. The thermally-conductive component bond layer is more specifically referred to herein as a "high κ component bond layer" or a "high thermal conductivity component bond layer" when possessing a thermal conductivity or "κ value" exceeding about 30 W/mK. In this regard, embodiments of the microelectronic system are usefully fabricated to include a high κ component bond layer, which is composed of a sintered body of material possessing relatively high thermal and electrical conductivities. Such sintered material bodies can be created by subjecting metal-particle containing precursor materials to low temperature sintering processes; e.g., sintering processes having peak processing temperatures maintained below a relatively low threshold value, such as the melt or softening point of solder materials also present within the microelectronic system. Metal particle-containing precursor materials of this type can be readily applied, whether in a wet or dry state, into the tunnel of a given substrate at a desired juncture during the manufacturing process. For example, in one approach, a heat-generating microelectronic component is first soldered or otherwise attached to the frontside of a substrate at a location covering the through-substrate tunnel. The substrate is then inverted, and a metal particle-containing precursor material is applied into the tunnel (e.g., as a dispensed paste) and onto the microelectronic component. A sintering process is subsequently carried-out, possibly following additional processing steps (e.g., insertion of a thermal conduit member), to transform the metal particle-containing layer precursor material into a sintered, high κ component bond layer.

By virtue of the above-described process, a thermally-conductive component bond layer and, perhaps, a high κ component bond layer is formed in intimate or direct contact with the heat-generating microelectronic component attached to the substrate. Due at least partly to the high thermal conductivity of the component bond layer, the embedded heat dissipation structure provides enhanced conductive heat flow away from the heat-generating microelectronic component and adjoining regions of the microelectronic system. In particular, conductive heat flow may be greatly enhanced as compared to a conventional microelectronic system of the type which relies exclusively upon solder materials to attach a heat-generating microelectronic component to a metal slug of an embedded coin substrate. Peak localized temperatures occurring within the thermal stack and, specifically, at the component-substrate juncture may be decreased as a result. As an additional benefit, the component bond layer can be formulated to have thermal tolerances well exceeding those of conventional solder materials; e.g., when predominately composed of an Ag, Au, and/or Cu sintered material, by wt %, embodiments of the component bond layer may have thermal tolerances approaching or exceeding 200° C. Comparatively, the thermal tolerances of legacy solder materials are often less than 125° C. The provision of the component bond layer can consequently enable operation of the microelectronic system at higher power levels and/or higher (e.g., RF) frequencies, while limiting internal system temperatures and preventing premature fatigue of joints or layer-to-layer interfaces within the microelectronic system.

In various embodiments, the embedded heat dissipation structure may further contain at least one thermal conduit member; that is, a prefabricated structure or device providing a relatively robust thermal conduction path for heat flow through the substrate body and away from the heat-generating microelectronic component mounted thereto. The thermal conduit member can be realized as a monolithic body or single piece part, such as a metallic coin or slug; as a composite metallic structure, such as a laminated multilayer heatsink; as an elongated heat pipe; or as a combination thereof. The shape of the thermal conduit member can also vary and may range from relatively simple, block-like geometries to more complex geometries having, for example, T-shaped, U-shaped, and pyramidal profiles. Regardless of its particular shape and construction, the thermal conduit member may include a proximal end portion and an opposing distal end portion, as defined based upon their relatively proximity to a heat-generating microelectronic component. The proximal end portion of the thermal conduit member is usefully positioned adjacent or immediately beneath the heat-generating microelectronic component, in either a non-contacting or contacting relationship. Comparatively, the distal end portion of the thermal conduit member may be recessed relative to the backside of the substrate, may be substantially flush or coplanar therewith, or may instead extend beyond the substrate backside by a certain distance. In some implementations, the distal end portion of the thermal conduit member may be received within an opening provided in a larger heatsink or chassis to which the substrate is mounted; or, as another possibility, the distal end portion of the thermal conduit manner may be bonded to a thermally-conductive cap piece, which is received within such an opening.

When containing a thermal conduit member, the embedded heat dissipation structure may further include a conduit bond layer, which contacts and is bonded to an outer peripheral portion of the thermal conduit member. The conduit bond layer may extend around an outer peripheral portion of the thermal conduit member and, perhaps, may substantially fill a peripheral clearance between the thermal conduit member and the inner sidewalls of the substrate defining the tunnel. When included within the heat dissipation structure, the conduit bond layer may or may not be formed from the same material as is the (e.g., high κ) component bond layer. For example, in one embodiment, a conduit bond layer and a high κ component bond layer are integrally formed as a unitary body from a sintered material of the type described above; e.g., by depositing a relatively large volume of a metal particle-containing precursor material into the tunnel following component attachment, inserting the thermal conduit member into the tunnel such that the proximal end of the conduit member presses into the precursor material and flows around the conduit member, and then sintering the precursor material to concurrently form the component bond layer and the conduit bond layer. In other embodiments, the component bond layer can be composed of a first material (e.g., sintered material), while the conduit bond layer is composed of a second material (e.g., a solder or epoxy) having a thermal conductivity less than that of the first material. In still further implementations, the embedded heat dissipation structure may lack a thermal conduit member and/or a conduit bond layer. This may be the case when, for example, a relatively thin substrate is utilized, and the through-substrate tunnel is substantially or wholly filled by the (e.g., high κ) component bond layer.

Various other useful features can be included in embodiments of the embedded heat dissipation structure and, more generally, of the microelectronic system. For example, in embodiments in which the (e.g., high κ) component bond layer is composed of a material prone to migration, such as a sintered material predominately composed of Ag by wt %, the microelectronic system may still further include an annular or ring-shaped containment structure referred to herein as a "bond layer containment ring." In such embodiments, the bond layer containment ring may be formed around at least a portion of the high κ component bond layer and, therefore, serve as a physical barrier to prevent or at least deter the outward migration of the bond layer material toward the outer periphery of the microelectronic component over time. When provided, such a bond layer containment ring is conveniently (although not necessarily) defined when patterning a solder mask layer deposited onto the substrate prior to attachment of the microelectronic component. Additional description of an exemplary bond layer containment ring and various other features potentially contained within the microelectronic system will now be set-forth in conjunction with FIGS. 1-3.

Figure 2:
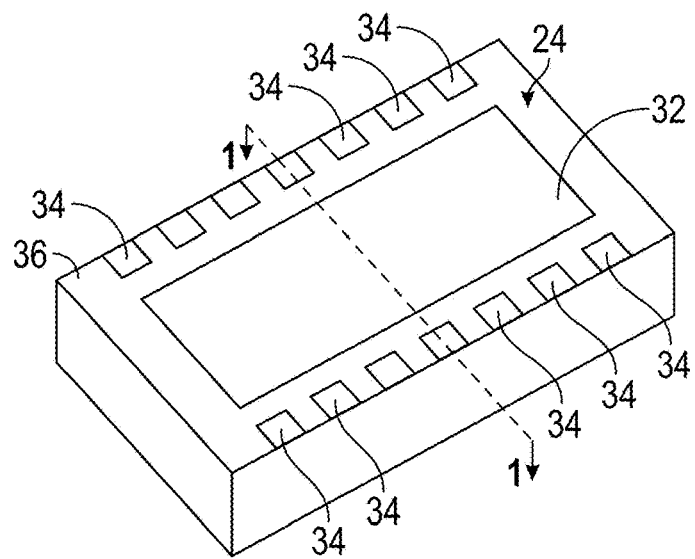
FIG. 2 is an isometric view of the heat-generating microelectronic component shown in FIG. 1, as illustrated in an exemplary implementation in which the microelectronic component assumes the form of a no-lead PAM package having a ground pad electrically coupled to the embedded heat dissipation structure.

Non-Limiting Example of a Microelectronic System Having an Embedded Heat Dissipation Structure FIG. 1 is a simplified, cross-sectional view of a microelectronic system 20 featuring an embedded heat dissipation structure 22, as illustrated in accordance with an exemplary embodiment of the present disclosure. In addition to embedded heat dissipation structure 22, microelectronic system 20 includes at least one heat-generating microelectronic component 24 attached to a substrate 26, such as a multilayer PCB. While only a limited portion of microelectronic system 20 is shown in FIG. 1, the non-illustrated portions of microelectronic system 20 can contain various other features, which are similar to or vary relative to the illustrated features of system 20. For example, the non-illustrated regions of microelectronic system 20 may support other microelectronic components, such as other microelectronic (e.g., PAM) packages, passive devices, or bare semiconductor die, which may be interconnected with microelectronic component 24 via the routing features or wiring layers of substrate 26. Additional heat dissipation structures similar or identical to embedded heat dissipation structure 22 may also be formed in the other, non-illustrated regions of microelectronic system 20, as desired.

Heat-generating microelectronic component 24 can be any microelectronic device or device-containing package prone to excess heat generation during operation. In certain instances, microelectronic component 24 can be an unpackaged semiconductor die carrying one or more ICs, which provide signal amplification, processing, memory, and/or RF functionalities. Alternatively, microelectronic component 24 can assume the form of a Microelectromechanical Systems (MEMS) device, a power transistor die or packaged device, an amplifier, an optical device, a passive device, an inverter switch, an RF antenna structure, or other small scale electronic device susceptible to excess heat generation in at least some instances. As a still further possibility, microelectronic component 24 can be realized as a microelectronic package or module containing one or more RF devices, such as power semiconductor die carrying ICs having RF functionalities. As a more specific example, heat-generating microelectronic component 24 may assume the form of a PAM package in embodiments. In this case, microelectronic component 24 may contain a package body 30, which houses at least one semiconductor die carrying RF amplification circuitry, such as power transistor die. As illustrated in FIG. 1, and as further isometrically illustrated in FIG. 2, microelectronic component 24 has a no-lead form factor and includes a number of I/O terminals 34, which are spaced in rows on opposing sides of a central ground pad 32. In essence, ground pad 32 may serve as an electrically-active flange or heatsink, which provides both grounding and heat removal from the power device(s) contained within component 24. In certain embodiments, such a PAM package can be interconnected with a plurality of other PAM packages to yield a massive MIMO antenna architecture.

Substrate 26 can assume any form suitable for supporting heat-generating microelectronic component 24, providing that substrate 26 includes at least one through-hole or tunnel 42 in which embedded heat dissipation structure 22 can be formed, in whole or in substantial part. Substrate 26 may or may not contain electrically-conductive routing features, such as wiring layers or metal levels, layer-to-layer electrical connections (e.g., electrically-conductive vias or metal plugs), and other such features for conducting electrical signals, applying voltages, and the like. In the embodiment shown in FIG. 1, substrate 26 assumes the form of a multilayer PCB having a frontside 38 and an opposing backside 40. A first patterned metal layer 46 is provided along substrate frontside 26 and defines traces, pads, and similar electrically-conductive features in electrical communication with microelectronic component 24 and, perhaps, other microelectronic components contained within system 20. Further, in this example, three internal wiring layers or patterned metal levels 48, 50, 52 are further contained in substrate 26 and interspersed with four dielectric layers 54, 56, 58, 60. In other embodiments, substrate 26 may have a greater or lesser number of layers; or may assume a different form, such as that of a coreless substrate or an interposer including or lacking routing features. Substrate 26 may or may not have backside metallization; that is, traces formed along backside 40.

As indicated above, an aperture, through-hole, or tunnel 42 is provided through substrate 26. Tunnel 42 can be formed through substrate 26 by laser drilling, mechanical drilling, or utilizing another process. The interior sidewalls of substrate 26 defining tunnel 42 may be plated, in part or in entirety, with a metallic (e.g., Au) plating. The planform dimensions and shape of tunnel 42 (that is, the tunnel dimensions and shape as viewed along the Y-axis identified in FIG. 1 by coordinate legend 44 or in a plane parallel to the X-Z plane) may vary amongst embodiments. In many cases, tunnel 42 will have planform dimensions (e.g., width or diameter) less than those of microelectronic component 24 and, perhaps, substantially equivalent to or less than the planform dimensions of ground pad 32. Tunnel 42 will often have a rectangular planform geometry when viewed from a top-down or planform perspective. However, in other embodiments, through-substrate tunnel 42 may have an ovular, racetrack, circular, or other planform shape. Embedded heat dissipation structure 22 occupies tunnel 42 and may fill tunnel 42, in whole or in substantial part, in embodiments of microelectronic system 20. In this manner, and as discussed more fully below, embedded heat dissipation structure 22 can provide a robust thermal conduction path extending from substrate frontside 38 (or from the microelectronic component 24 if recessed within substrate 26) to and, perhaps, beyond substrate backside 40.

Embedded heat dissipation structure 22 contains at least one thermally-conductive component bond layer 64. As shown in FIG. 1, component bond layer 64 may be located beneath and directly contact microelectronic component 24, specifically contacting a central portion of ground pad 32 in the illustrated example. Thermally-conductive component bond layer 64 can be composed of a wide variety of materials, which possess relatively high thermal conductivities and provide requisite bond strength. When heat dissipation structure 22 is additionally utilized for electrical interconnection purposes, thermally-conductive component bond layer 64 may further be formulated to provide a relatively high electrical conductivity. Thermally-conductive component bond layer 64 can be composed of various metal-filled epoxies, solders, and other materials having such characteristics. In many instances, thermally-conductive bond layer 64 is advantageously composed of sintered material having a thermal conductivity exceeding about 30 W/mK. As previously noted, component bond layer 64 may be more specifically referred to as "high κ component bond layer 64" when having a thermal conductivity exceeding this threshold value. As component bond layer 64 is beneficially produced as a sintered, high κ component bond layer in embodiments, the following description principally refers to component bond layer 64 as such. This notwithstanding, it is emphasized that component bond layer 64 need not have a thermal conductivity exceeding 30 W/mK, nor be composed of a sintered material in all embodiments of microelectronic system 20.

The particular composition of high κ component bond layer 64 will vary amongst embodiments. When formed by sintering a metal particle-containing precursor material, the composition of high κ component bond layer 64 will differ depending upon the initial formulation of the sinter precursor material and the parameters of the sintering process.

Generally, in such embodiments, high κ component bond layer 64 will be predominately composed of at least one sintered metal, by wt %. More specifically, in embodiment, high κ component bond layer 64 may be predominately composed and, perhaps, consist essentially of Cu, Ag, Au, or a mixture thereof by wt %. In such embodiments, high κ component bond layer 64 may or may not contain organic materials. For example, in certain implementations, high κ component bond layer 64 may be essentially free of organic materials; the term "essentially free," as appearing herein, defined as containing less than 1 wt % of organic materials. In other embodiments, high κ component bond layer 64 may contain selected organic materials or fillers to tailor the properties of bond layer 64, as appropriate to suit a particular application or design purpose. As a more specific example, high κ component bond layer 64 may contain an epoxy or another organic material added to increase layer strength. When predominately composed of sintered materials of the type described herein, high κ component bond layer 64 may possess a thermal conductivity exceeding about 35 W/mK, more preferably exceeding about 50 W/mK, and still more preferably exceeding about 70 W/mK. Examples of sintering processes suitable for producing high κ component bond layer 64 during fabrication of microelectronic system 20 are further described below in conjunction with FIGS. 6-7.

Embedded heat dissipation structure 22 can further contain at least one thermal conduit member 62 and a thermal conduit bond layer 66. In the embodiment shown in FIG. 1, thermal conduit bond layer 66 contacts an outer peripheral portion of thermal conduit member 62 to help secure member 62 within tunnel 42. Conduit bond layer 66 may thus extend around an outer periphery of thermal conduit member 62 and fill or substantially fill the peripheral clearance or gap located between member 62 and the inner sidewalls of substrate 26 defining tunnel 42. Conduit bond layer 66 may or may not be formed from the same material as is high κ component bond layer 64. For example, in certain implementations, high κ component bond layer 64 can be composed of a sintered material, while conduit bond layer 66 is composed of a non-sintered material (e.g., a solder or epoxy) having a thermal conductivity less than that of component bond layer 64. In this manner, a material having high thermal and electrical conductivities in the form of high κ component bond layer 64 may be provided at or adjacent the component-substrate juncture, while a different (e.g., less costly) material is utilized to secure at least the proximal end portion of thermal conduit member 62 within tunnel 42. In other embodiments, conduit bond layer 66 and high κ component bond layer 64 may both be composed of the same or similar sintered materials and, perhaps, integrally formed as a unitary body utilizing common precursor material application and sintering processes, as discussed more fully below in conjunction with FIGS. 4-7.

As labeled in FIG. 1, thermal conduit member 62 has a proximal end portion 61 and an opposing distal end portion 63. When thermal conduit member 62 is installed within tunnel 42, proximal end portion 61 is positioned adjacent (e.g., immediately beneath) heat-generating microelectronic component 24, as taken along an axis orthogonal to frontside 38 of substrate 26 (corresponding to the Y-axis of coordinate legend 44). Proximal end portion 61 may contact microelectronic component 24 and, specifically, ground pad 32 in embodiments of microelectronic system 20. It will often be the case, however, that proximal end portion 61 is spaced or axially offset from microelectronic component 24 by a relatively small axial offset or gap, which is filled by high κ component bond layer 64. Accordingly, at least a portion of high κ component bond layer 64 may be located between proximal end portion 61 and microelectronic component 24 such that ground pad 32 is thermally and electrically coupled to thermal conduit member 62 through component bond layer 64. In certain embodiments, proximal end portion 61 and distal end portion 63 will be located substantially adjacent frontside 38 and backside 40 of substrate 26, respectively. Alternatively, proximal end portion 61 may be positioned adjacent frontside 38 of substrate 26, while distal end portion 63 of thermal conduit member 62 may be recessed relative thereto or, perhaps, may extend beyond substrate frontside 38 by a certain distance. Additional description in this regard is provided below in conjunction with FIGS. 8 and 9.

When viewed in three dimensions, thermal conduit member 62 will often have a relatively simple, block-like geometry in embodiments of microelectronic system 20. In other instances, conduit member 62 may have a more complex geometry including geometries characterized by T-shaped, U-shaped, and pyramidal profiles, as viewed along the Y-X plane and/or Y-Z plane of coordinate legend 44. Generally, thermal conduit member 62 is usefully selected to have a planform geometry (shape and dimensions) substantially conforming with the planform geometry of tunnel 42, while providing a relatively small circumferential gap between an outer periphery of conduit member 62 and the inner periphery of tunnel 42. Thermal conduit member 62 will often be dimensioned or sized to occupy the volumetric majority of tunnel 42; however, this is not necessary in all embodiments, noting that multiple thermal conduit members can be positioned in a single tunnel in alternative of microelectronic system 20.

Thermal conduit member 62 can assume the form of any prefabricated structure or part having a relatively high thermal conductivity, which exceeds that of substrate 26 from frontside 38 to backside 40. The thermal conductivity of conduit member 62 may also be substantially equivalent to or exceed that of high κ component bond layer 64 in certain embodiments. For example, in one group of embodiments, thermal conduit member 62 is a monolithic body of material. In such embodiments, thermal conduit member 62 can be composed of a metallic material, a non-metallic material, or a composite material having a relatively high thermal conductivity. Suitable metallic materials include Al, Cu, and nickel (Ni), as well as alloys thereof. Suitable non-metallic materials and composites include diamond polycarbonate materials, diamond-metal composites (e.g., diamond Au, diamond Ag, and diamond Cu), pyrolytic graphite, and materials containing allotropes of carbon, such as graphene and carbon nanotube-filled materials. In other embodiments, thermal conduit member 62 can have a non-monolithic constructive, such as a layered construction. For example, in this latter case, thermal conduit member 62 can be fabricated to contain one or more metal (e.g., Cu) layers interspersed with other metallic layers, such as molybdenum (Mo) or a copper-molybdenum (Cu—Mo) alloy layers, having a CTE less than that of the Cu layer(s). In this manner, the effective CTE of thermal conduit member 62 can be more closely matched to substrate 26, heat-generating microelectronic component 24, and/or another portion of microelectronic system 20.

Thermal conduit member 62 may assume still other forms in further embodiments. For example, as a further possibility, thermal conduit member 62 may assume the form of a heat pipe; that is, a hermetically-enclosed tube containing a working fluid (e.g., an ammonia, alcohol, and/or water mixture), which transfers heat from one end of the tube (proximal end portion 61) to an opposing end of the tube (distal end portion 63) in a thermally-efficient manner. The fluid within the heat pipe undergoes a phase change and, specifically, may absorb latent heat and vaporize at the hot interface of the heat pipe (e.g., a first closed end); the vapor phase flows to the relatively cool interface of the heat pipe (e.g., an opposing closed end) and condenses to release latent heat; and the liquid phase then returns to the hot interface to complete the heat transfer circuit. When assuming the form of a heat pipe, thermal conduit member 62 may contain or be internally lined with a wicking material, which promotes flow of the liquid phase from the cold interface to the hot interface via capillary action. Although by no means limited to a particular shape or material, the shell of the heat pipe may assume the form of an elongated, blind tube fabricated from a thermally-conductive metal or alloy, such as Cu or Al. Generally, thermal conduit member 62 is usefully implemented as a heat pipe in embodiments in which conduit member 62 is relatively lengthy, as may be the case when substrate 26 is relatively thick and/or conduit member 62 extends beyond substrate backside 40 to project from substrate 26 by some distance in the manner discussed more fully below in conjunction with FIGS. 8 and 9.

As noted above, distal end portion 63 of thermal conduit member 62 can be recessed with respect to substrate backside 40. In this case, thermally-conductive materials, such as sintered metals, may be placed in contact with distal end portion 63 (e.g., as distal bond layer 84) to preserver a relatively high level of thermal conductivity through the desired heat flow path or thermal stack. In other embodiments, distal end portion 63 of thermal conduit member 62 may be substantially flush or coplanar with respect to substrate backside 40 or, perhaps, may extend beyond substrate backside 40 in a direction away from microelectronic component 24 by some amount. Further, a wide range of options is presented for tailoring the geometry and construction of distal end portion 63 to enhance conductive or convective heat removal from conduit member 62. For example, in certain implementations, distal end portion 63 of thermal conduit member 62 and, more generally, of embedded heat dissipation structure 22 can be placed in thermal contact with chassis 28 or another thermally-conductive body, which serves as a heatsink or heat spreader during operation of microelectronic system 20. In the illustrated embodiment, specifically, distal end portion 63 of thermal conduit member 62 is bonded to a plug-like heat spreader cap piece 88 through a distal bond layer 84. When present, distal bond layer 84 can be a sintered material, a die attach material, a thermally-conductive epoxy, a solder material, or another thermally-conductive bonding material. In one useful approach, distal bond layer 84 is integrally formed with conduit bond layer 66 and high κ component bond layer 64 utilizing a common sinter bonding process of the type described below in conjunction with FIGS. 4-7. In still further embodiments, heat spreader cap piece 88 may be joined to thermal conduit member 62 in another manner, such as by crimping or utilizing fasteners; heat spreader cap piece 88 may be integrally formed with thermal conduit member 62 as a single piece; or heat spreader cap piece 88 may be omitted from microelectronic system 20.

Heat-generating microelectronic component 24 can be attached to substrate 26 in various different manners. In the illustrated embodiment of FIG. 1, specifically, solder bodies or contacts 68, 70, 72, 74 are utilized to attach terminals provided on heat-generating microelectronic component 24 to corresponding bond pads present on PCB frontside 38 thereby further securing microelectronic component 24 to substrate 26. Solder contacts 68, 74, specifically, provide mechanical and electrical connections between bond pads provided on substrate 26 and I/O terminals 34 of microelectronic component 24. Comparatively, solder contacts 70, 72 are bonded to an outer peripheral portion of ground pad 32. When viewed in three dimensions, solder contacts 70, 72 may be joined to form a complete ring around the proximal end of embedded heat dissipation structure 22. Alternatively, solder contacts 70, 72 may be discrete or discontinuous bodies of solder formed at selected locations around the proximal end of heat dissipation structure 22. Ground pad 32 is thus secured to substrate 26 by both solder contacts 70, 72; as well as by high κ component bond layer 64, which may or may not be composed of solder.

A patterned solder mask layer 76 is further formed over PCB frontside 38 between microelectronic component 24 and substrate 26. Solder mask layer 76 is patterned to provide the desired electrical isolation between solder contacts 68, 70, 72, 74. Additionally, solder mask layer 76 may be patterned to define an annular or ring-shaped containment structure or shell 78, hereafter referred to as "bond layer containment ring 78." Bond layer containment ring 78 generally circumscribes the mouth or opening of tunnel 42, which penetrates frontside 38 of substrate 26. Depending upon the respective compositions of high κ component bond layer 64 and solder contacts 70, bond layer containment ring 78 may present undesired chemical reactions between disparate materials in certain instances. Additionally or alternatively, bond layer containment ring 78 may prevent or physically deter undesired migration of high κ component bond layer 64, particularly bond layer region 66, in a laterally outward direction toward the outer periphery of heat-generating microelectronic component 24 and solder contacts 68, 74. Bond layer containment ring 78 is thus beneficially provided when bond layer 64 is composed of a material prone to gradual migration, such as certain sintered (e.g., Ag) materials. In other embodiments, bond layer containment ring 78 can be formed in another manner, such as by depositing a ring of epoxy ahead of device attachment or by fabricating microelectronic component 24 to include an annular projection serving as bond layer containment ring 78.

Microelectronic system 20 may further include or may be utilized in conjunction with chassis 28. Substrate 26 may be mounted to chassis 28 in a manner placing substrate backside 40 adjacent and, perhaps, in intimate or direct contact with support wall 80 of chassis 28. In other embodiments, one or more intervening layers or structures, such as a thermally-conductive cloth, may be disposed between substrate backside 40 and chassis 28. An adhesive material, fasteners (e.g., bolts or screws), or another attachment technique can be utilized to secure substrate 26 to chassis 28. In embodiments, chassis 28 is composed of a material having a relatively high thermal conductivity, such as an Al or other metal. In essence, then, chassis 28 serves as a relatively large heat spreader or as a primary heatsink of microelectronic system 20. If desired, chassis 28 can be produced to include a number of extensions or fins 82 (only a few of which are labeled in FIG. 1) to increase the convectively-cooled surface area of support wall 80. Additionally or alternatively, chassis 28 can be exposed to an actively-circulated liquid or gas coolant for enhanced heat removal. In one common approach, a micro fan or other mechanism may direct forced airflow over the outer surface of chassis 28 during system operation. When provided, heat spreader cap piece 88 may pilot with or register to an opening 86 in support wall 80 in a close-fitting relationship.

In such embodiments, heat spreader cap piece 88 may also be fabricated from a metal or other material having a relatively high thermal conductivity and may include surface area-increasing projections 90 (e.g., fins or pins), which may generally align with projections 82 of chassis 28.

Figure 3:
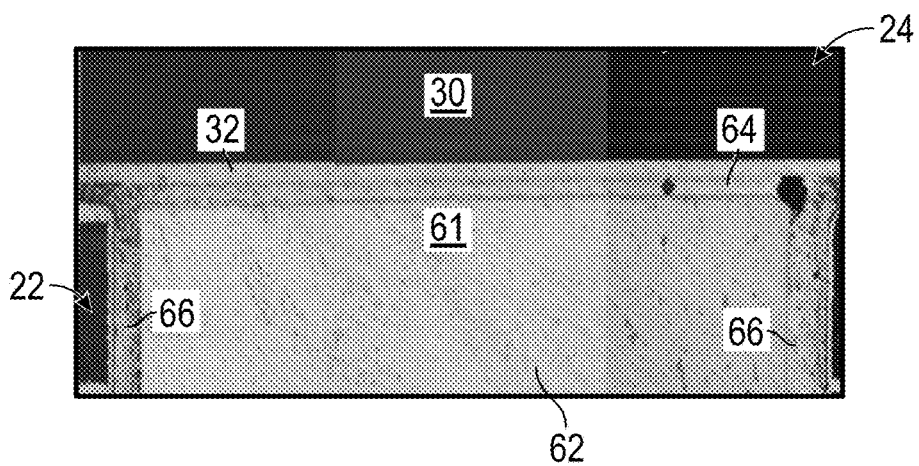
FIG. 3 is a scanning electron microscope image of a juncture region between the microelectronic component and the embedded heat dissipation structure shown in FIG. 1, as reduced to practice.

Turning now to FIG. 3, there is shown a Scanning Electron Microscope (SEM) image encompassing a juncture region between microelectronic component 24 and embedded heat dissipation structure 22 in an actual or "real world" embodiment of microelectronic system 20. This juncture region is of particular importance in promoting heat flow from microelectronic component 24 and into thermal conduit member 62. In this regard, high κ component bond layer 64 supports efficient conductive heat transfer from heat-generating microelectronic component 24 and into proximal end portion 61 of thermal conduit member 62. Thus, in the present example, excess heat is conductively removed from the central portion of ground pad 32, which tends to reach elevated temperatures more quickly than does the outer peripheral portion of ground pad 32 to which solder contacts 70, 72 are joined (FIG. 1). Moreover, high κ component bond layer 64 may have a temperature tolerances that approaches or exceeds 200° C. in certain instances, such as when bond layer 64 is composed of a Ag, Cu, or Au-based sintered material. Such temperatures tolerances well-exceed those of conventional solder materials, which tend to rapidly fatigue and fail at temperatures approaching or exceeding approximately 125° C. Embedded heat dissipation structure 22 consequently enables operation of heat-generating microelectronic component 24 at higher power levels and/or frequencies with reduced peak temperatures within the thermal stack and improved preservation of joint integrity at interfaces between microelectronic component 24 and heat dissipation structure 22.

Embedded heat dissipation structure 42 is advantageously, although non-essentially utilized to electrically interconnect one or more terminals of microelectronic component 24 to other electrically-active features or devices contained within microelectronic system 20. This may be particularly beneficial when microelectronic component 24 assumes the form of a PAM package or another RF device, which is desirably grounded in a relatively robust and direct manner. As indicated most clearly in FIG. 1, heat dissipation structure 42 may provide an electrically-conductive path from ground pad 32 through component bond layer 64 and, perhaps, through conduit bond layer 66 to an internal wiring layer within substrate 26 utilized for grounding purposes. In one embodiment, the internal wiring layer located closest microelectronic component 24 (i.e., wiring layer 48) as taken along an axis orthogonal to frontside 38 (corresponding to the Y-axis of coordinate legend 44) is realized as an RF grounding layer such that embedded heat dissipation structure 42 provides a relatively robust (large volume) and direct electrical path from ground pad 32 to RF ground layer 48. Further, in implementations in which high κ component bond layer 64 and at least a portion of conduit bond layer 66 are composed of a sintered material of the type herein, the most direct or shortest electrically-conductive path from ground pad 32 to RF ground layer 48 can extend exclusively through the selected sintered material or materials. Again, such sintered materials can be composed of sintered Cu, Ag, Au, or other sintered metals having relatively high electrical conductivities in additional to relatively high thermal conductivities. A robust RF grounding scheme is thus created within microelectronic system 20, which can be fabricated in a relatively straightforward and cost-effective manner (e.g., without requiring the formation of additional vias). An exemplary process for fabricating microelectronic system 20 will now be described in conjunction with FIGS. 4-7.

Examples of Microelectronic System Fabrication Methods

An exemplary fabrication process for manufacturing microelectronic system 20 will now be described in conjunction with FIGS. 4-7. The below-described process steps are provided by way of non-limiting example only. In further implementations, the below-described process steps may be performed in alternative sequences, certain steps may be omitted, and various other process steps can be introduced into the fabrication process. Further, if desired, multiple microelectronic systems similar or identical to microelectronic system 20 may be fabricated in parallel by performing the below-described process steps globally across a relatively large substrate or panel, which is subsequently singulated to yield a plurality of discrete units. For the purposes of the following description, a prime symbol (') will be appended to those reference numerals designating structural elements or items in a non-completed or transitional state. For example, in each of FIGS. 4-7, microelectronic system 20 is shown in a partially completed state and thus identified utilizing reference numeral "20'."

Figure 4:
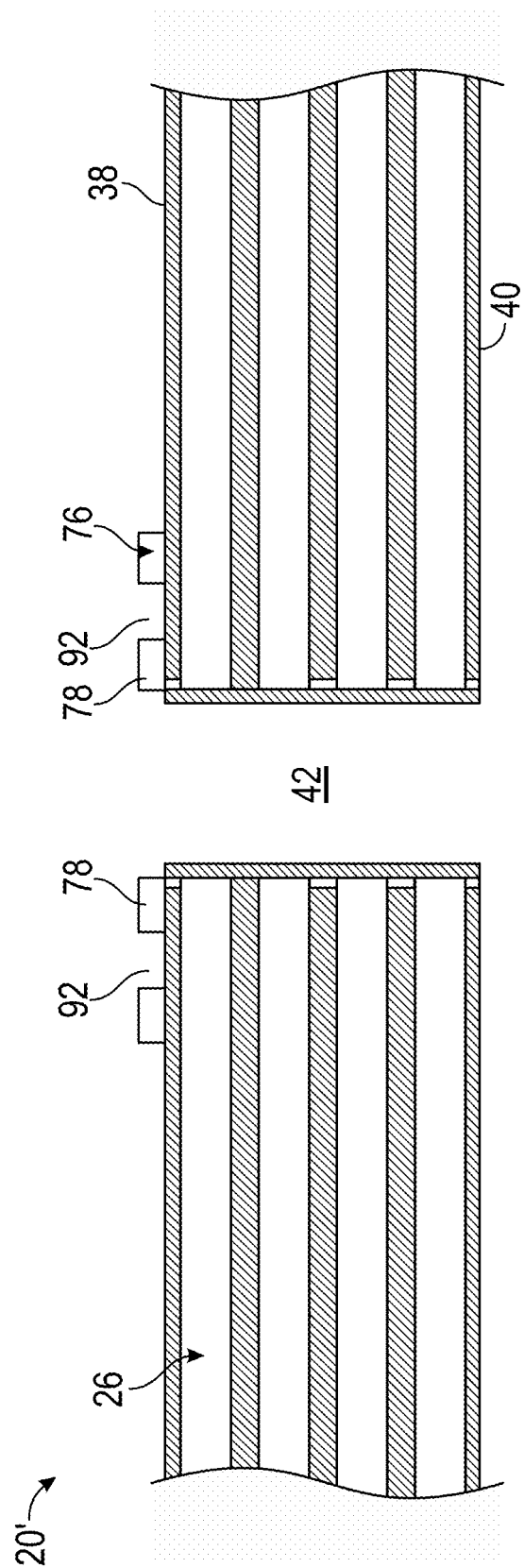
FIGS. 4-7 are cross-sectional views of the microelectronic system shown in FIG. 1, as shown at various stages of fabrication and produced in an accordance an exemplary microelectronic system fabrication process.

Referring initially to FIG. 4, the microelectronic system fabrication process commences with the initial acquisition or obtainment of substrate 26. As appearing herein, the term "obtain" encompasses both independent fabrication, as well as acquisition from a supplier. Substrate 26 can thus be obtained by independent fabrication to commence the fabrication process, but will more commonly be purchased from a third party supplier or vendor, such as a PCB manufacturer. When so purchased, tunnel 42 will typically be formed through substrate 26, with any desired plating of the tunnel sidewalls already applied. After obtaining substrate 26, patterned solder mask layer 76 is next formed on frontside 38 of substrate 26. In various embodiments, this may be accomplished by first depositing a blank solder mask layer over frontside 38 of substrate 26 and, specifically, around a perimeter of the opening of tunnel 42 penetrating frontside 38. The blank solder mask layer is then patterned (e.g., lithographically) to create a number of solder mask openings 92 in the solder mask layer. Openings 92 further also define bond layer containment ring 78, which may extend around the opening or mouth of tunnel 42 as seen from frontside 38 of substrate 26. As indicated in FIGS. 1, 3, and 4, bond layer containment ring 78 may located be immediately adjacent tunnel 42 in embodiments. In other implementations, bond layer containment ring 78 may be spatially offset from tunnel 42 as taken along the Z and/or X-axes (FIG. 1) such that a surface area region of frontside 38 of substrate 26 is present between tunnel 42 and containment ring 78. The solder mask layer may be patterned to impart containment ring 78 with 360 degree, continuous ring-shaped geometry, which fully extends around or circumscribes the opening of tunnel 42 penetrating frontside 38. Such a ring-shaped geometry will often have a polygonal (e.g., rectangular) planform geometry, but can have other ring-shaped planform geometries (e.g., circular or ovular geometries) in further embodiments.

Figure 5:
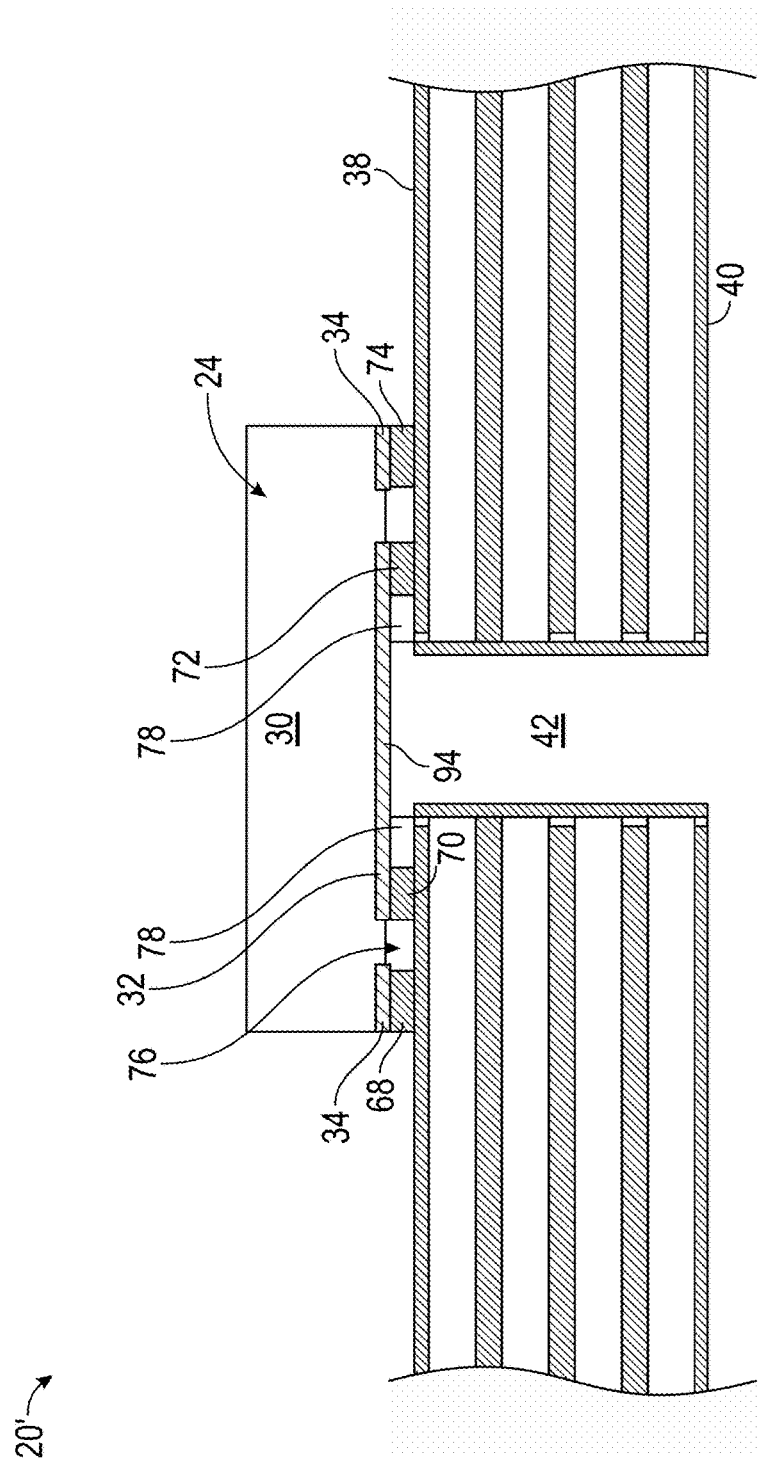

Advancing to FIG. 5, heat-generating microelectronic component 24 is attached to substrate 26. Various attachment materials can be utilized for this purpose, with solder being but one suitable example. In the illustrated example in which heat-generating microelectronic component 24 is attached to substrate 26 utilizing solder, discrete bodies or globules of solder (herein "solder contacts") 68, 70, 72, 74 may be screen printed or otherwise deposited onto frontside 38 of substrate 26 into the newly-defined solder mask openings 92. After deposition of the solder contacts, heat-generating microelectronic component 24 is placed its desired position utilizing, for example, a pick-and-place tool. When so positioned, heat-generating microelectronic component 24 contacts or seats upon solder contacts 68, 70, 72, 74 and patterned solder mask layer 76. Microelectronic component 24 is thus attached to substrate 26 at a location overlying bond layer containment ring 78, as taken along an axis orthogonal to substrate frontside 38 (corresponding to the Y-axis of coordinate legend 44 in FIG. 1). Additionally, microelectronic component 24 may also be positioned to cover or enclose tunnel 42 and, specifically, the opening of tunnel 42 penetrating frontside 38 of substrate 26. Heat treatment is then carried-out to reflow solder contacts 68, 70, 72, 74 and form the desired solder joints between solder contacts 68, 70, 72, 74; terminals or pads 32, 34 of microelectronic component 24; and the corresponding terminals or pads of substrate 26. As a result, the outer periphery of ground pad 32 is bonded to solder contacts 70, 72, while a central portion 94 of ground pad 32 remains exposed from the interior of tunnel 42 for subsequent bonding to embedded heat dissipation structure 22, as described below.

Figure 6:
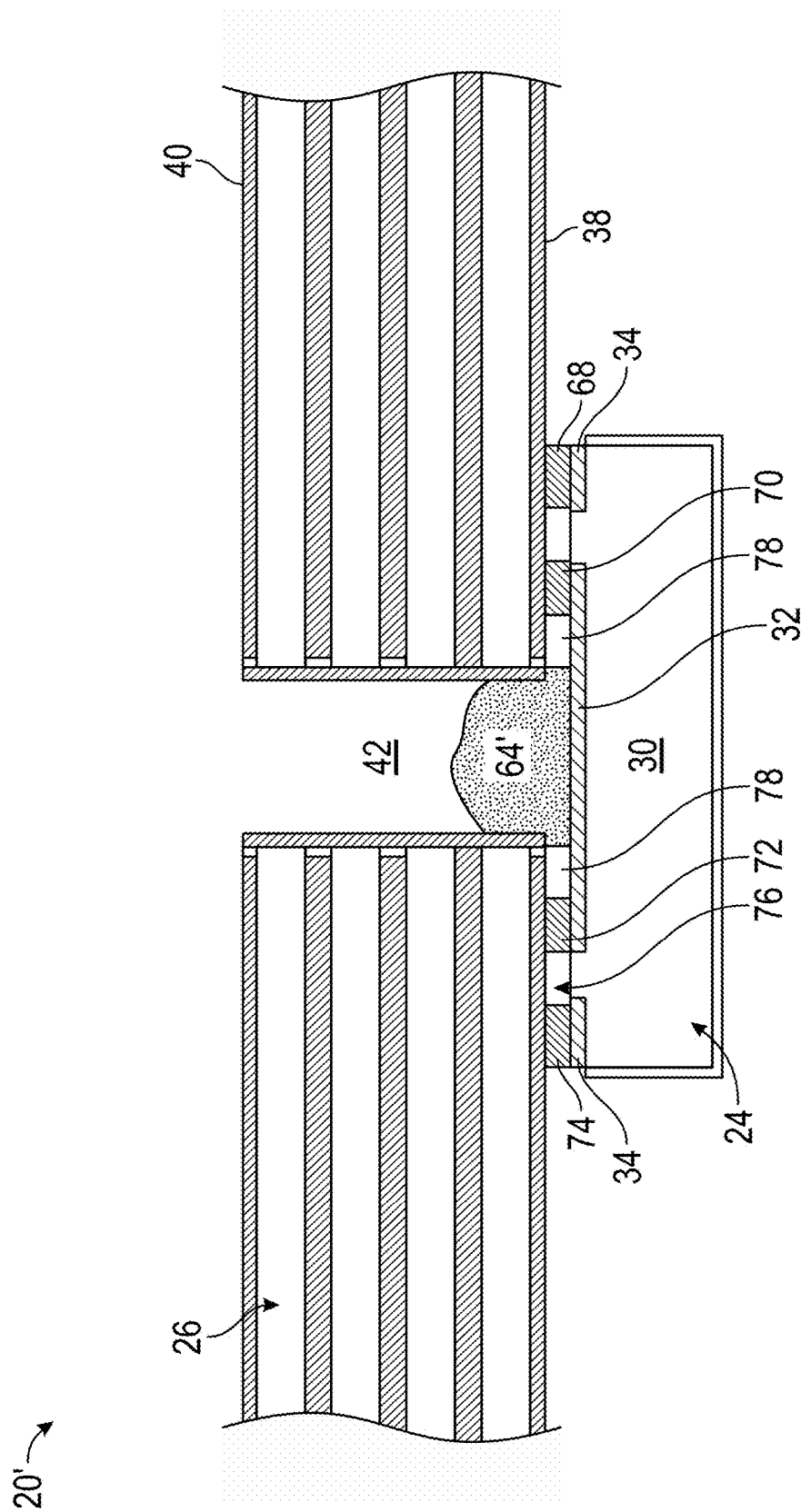
Figure 7:
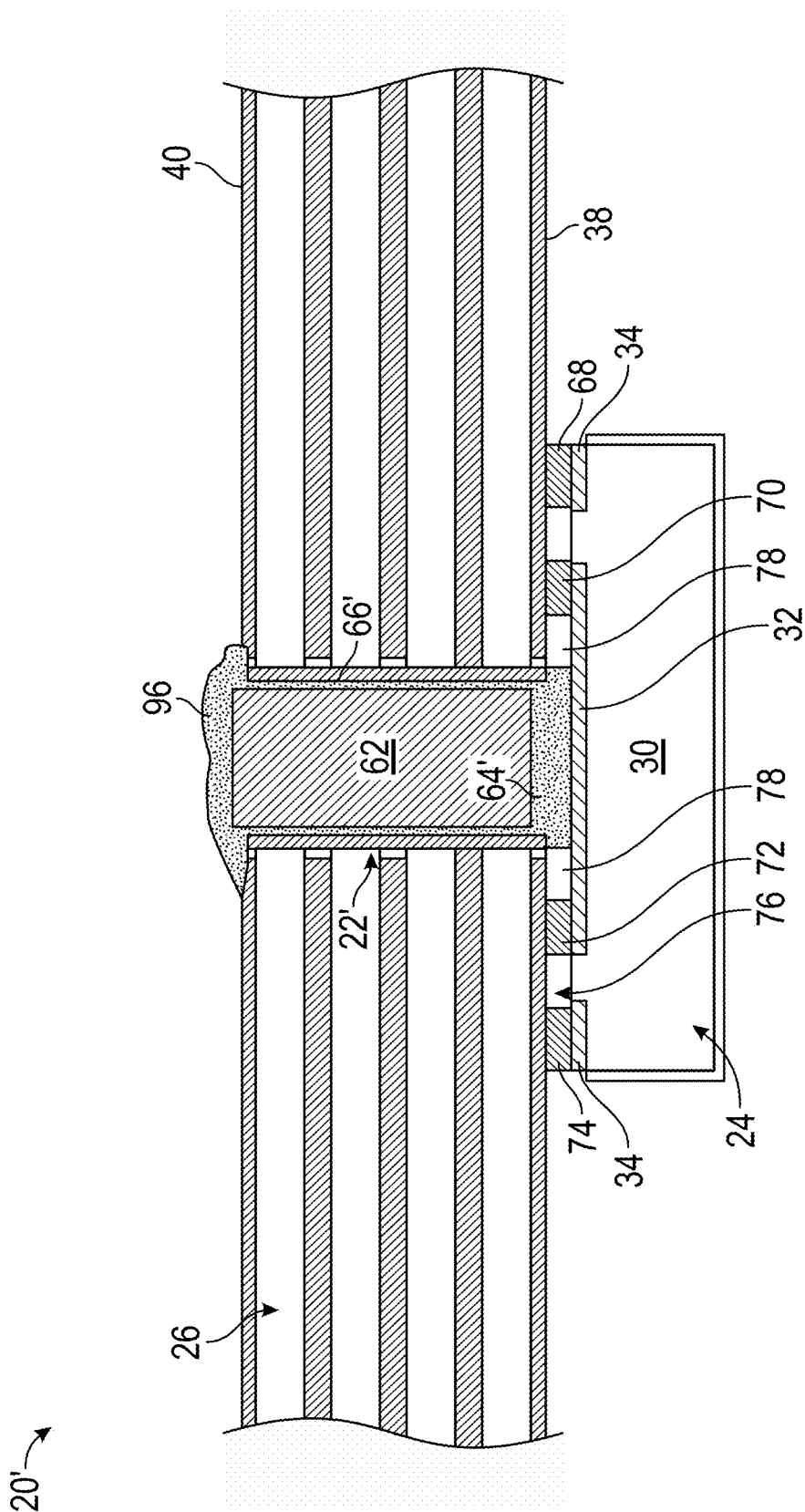

Embedded heat dissipation structure 22 is next formed within tunnel 42. One manner in which this can be accomplished is depicted in FIGS. 6 and 7. As generally shown in FIG. 6, substrate 26 and microelectronic component 24 may be inverted, and a metal particle-containing material may be applied into tunnel 42. The precursor material can be applied prior to, in conjunction with, or after insertion of thermal conduit member 62 into tunnel 42. It will often be the case, however, that the bond layer precursor material is applied into tunnel 42, in either a wet or dry state, prior to insertion of thermal conduit member 62; or that the precursor material is applied into tunnel 42 concurrently with insertion of thermal conduit member 62. In this latter regard, the bond layer precursor material may be applied to surfaces of thermal conduit member 62 by, for example, brushing or dipping prior to positioning of conduit member 62 (in whole or in part) within tunnel 42. Such approaches can also be combined to yield still further embodiments. While the present disclosure is open to all such possibilities, application of the bond layer precursor material into tunnel 42 prior to or in concert with insertion of thermal conduit member 62, rather than backfilling tunnel 42 with the precursor material following conduit member insertion, will better ensure that undesired voiding does not occur at junctures between the proximal end of thermal conduit member 62 and microelectronic component 24.

In various embodiments, and as further shown in FIG. 6, a predetermined volume of a bond layer precursor material 64' may be dispensed into tunnel 42 and onto heat-generating microelectronic component 24 in a wet state; e.g., as a metal particle-containing paste or slurry of the type described below. In this case, bond layer precursor material 64' may directly contact ground pad 32 and/or bond layer containment ring 78. Afterwards, and as shown in FIG. 7, thermal conduit member 62 may be pressed into the puddle or body of precursor material 64' such that precursor material 64' flows over and around an outer peripheral portion of thermal conduit member 62. Bond layer precursor material 64' may be deposited in sufficient volume to occupy all or substantially all of the free space or clearance provided between the outer periphery of thermal conduit member 62 and the interior sidewalls of substrate 26 defining tunnel 42. In this manner, bond layer precursor material 64' can be processed to concurrently form component bond layer 64 and thermal conduit bond layer 66 during the below-described sintering process. If desired, and as further indicated in FIG. 7, bond layer precursor material 64' can be dispensed in sufficient volume to outflow from tunnel 42 and appear as an overburden or excess portion 96. Excess portion 96 can then be cleared, or instead utilized to bond another structure to distal end portion 63 of thermal conduit member 62. For example, in this latter regard, excess portion 96 of bond layer precursor material 64' can be utilized to form distal bond layer 84 attaching heat spreader cap piece 88 to distal end portion 63 of thermal conduit member 62.

As previously noted, bond layer precursor material 64' can be applied into tunnel 42 utilizing either a wet state or dry state application technique. When applied in a wet state, bond layer precursor material 64' can be dispensed into tunnel 42 as a puddle or liquid state body, which is retained within the enclosed end portion of tunnel 42 by microelectronic component 24 and bond layer containment ring 78, as schematically indicated in FIG. 6. In other embodiments, bond layer precursor material 64' may be applied in a wet state to selected surfaces of thermal conduit member 62. Depending upon which approach is followed, wet state application techniques suitable for applying bond layer precursor material 64' include, but are not limited to, screen or stencil printing, doctor blading, spraying, dipping, and fine needle dispense techniques. Regardless of the particular application technique or techniques utilized, the surface(s) of one or more thermal conduit members 62 can be intentionally roughened, imparted with channels or grooves, or otherwise texturized to promote bonding with thermally-conductive bonding layer 64, 66 in certain instances.

When a wet state application technique is employed to introduce bond layer precursor material 64' into tunnel 42, a flowable or wet state bond layer precursor material is initially obtained by, for example, independent production or purchase from a third party supplier. In addition to metal particles of the type described below, the wet state bond layer precursor material (precursor material 64' shown in FIG. 6) may contain other ingredients (e.g., a solvent and/or surfactant) to facilitate wet set application, to adjust the viscosity of the precursor material, to prevent premature agglomeration of the metal particles, or to serve other purposes. In one embodiment, the wet state bond layer precursor material contains metal particles in combination with a binder (e.g., an epoxy), a dispersant, and a thinner or liquid carrier. The volume of solvent or liquid carrier contained within the bond layer precursor material can be adjusted to tailor the viscosity of the precursor material to the selected wet state application technique. For example, in an implementation in which the precursor material is desirably applied by screen printing or doctor blading, the bond layer precursor material may contain sufficient liquid to create a paste, slurry, or paint. After application of the wet state coating material, a drying process can be carried-out to remove excess liquid from the bond layer precursor material, if so desired.

In further embodiments, bond layer precursor material 64' can be applied utilizing a dry state application technique. In this case, precursor material 64' can be applied into tunnel 42 from backside 40 of substrate 26 as a loose powder or packing material. Similarly, precursor material 64' can be compressed into a powder preform in embodiments, which can be inserted into tunnel 42 in a close tolerance fit; e.g., in one approach, bond layer precursor material 64' may be provided as an annular or tubular preform, which is dimensioned to be inserted within tunnel 42 and which has a central channel into which thermal conduit member 62 can be pressed. As a still further possibility, a film transfer process or other dry state application technique can be utilized to apply the precursor material onto selected surfaces of thermal conduit member 62 prior to insertion of member 62 into tunnel 42. Notably, when it is desired to form component bond layer 64 from a sintered material, while forming some or all of conduit bond layer 66 from a non-sintered material, bond layer precursor material 64' may be applied in sufficient volume or on selected surfaces to form component bond layer 64 (and perhaps a portion of conduit bond layer 66) pursuant to sintering. This may leave a void space between a periphery of conduit member 62 and the inner sidewalls of substrate 26 defining tunnel 42, which may then be backfilled with solder, a conductive epoxy, or a similar material.

Regardless of whether precursor material 64' is applied in a wet or dry state, the metal particles dispersed within bond layer precursor material 64' can have any composition, shape, and size enabling the particles to form a substantially coherent adhesive layer pursuant to the below-described sintering process. In one embodiment, bond layer precursor material 64' contains Au, Ag, or Cu particles, or a mixture thereof. In another embodiment, the metal particles contained within precursor material 64' consist essentially of Ag or Cu particles. The metal particles contained within precursor material 64' may or may not be coated with an organic material. For example, in some implementations, the metal particles may be coated with an organic dispersant, which prevents physical contact between the particles to inhibit premature agglomeration or particle sintering. When present, any such organic particle coating may be burned away or thermally decomposed, whether in whole or in part, during the below-described metal sintering process. In still further embodiments, other material systems amenable to low temperature sintering, whether currently known or later developed, may be utilized in the microelectronic system fabrication process.

The metal particles contained within bond layer precursor material 64' can have any shape or combination of shapes including, but not limited to, spherical shapes, oblong shapes, and platelet or laminae shapes. The average dimensions of the metal particles will vary in conjunction with particle shape and process parameters. However, in general, the average maximum dimension of the metal particles (e.g., the diameter of the metal particles when spherical or the major axis of the metal particles when oblong) may be between about 100 microns (μm) and about 10 nanometers (nm) in an embodiment. In other embodiments, the metal particles may have average maximum dimensions greater than or less than the aforementioned range. In certain implementations, a mixture of metal particles having average maximum dimensions in both the nanometer and micron range may be present within the precursor material. In other implementations, only nanoparticles (that is, particles having average maximum dimensions between 1 and 1000 nm) may be contained within bond layer precursor material 64'. As a specific, albeit non-limiting example, precursor material 64' may contain at least one of Ag, Au, or Cu nanoparticles or micron-sized particles in an embodiment, with Ag or Cu nanoparticles preferred.

After application of bond layer precursor material 64' and positioning of thermal conduit member 62 within tunnel 42, a sintering process is carried-out. As appearing herein, the sintering process is considered a type of "curing," as are other techniques (including solder reflow) involving the application of heat, pressure, and/or particular wavelengths of light utilized to process a material into its final form or composition. In the case of the illustrated example, specifically, a low temperature sintering process may be performed to transform precursor material 64' into high κ component bond layer 64 and, perhaps, into conduit bond layer 66. Such a "low temperature" sintering process may be performed during which the peak processing temperatures are maintained below a peak processing temperature $T_{MAX}$. $T_{MAX}$ is preferably less than 300° C. in embodiments; and, more preferably, less than a melt point or softening point of the solder material utilized to form solder contacts 68, 70, 72, 74. In many cases, $T_{MAX}$ will also be significantly less than the melt point of the metal particles contained within precursor material 64' and, perhaps, less than one half the melt point of the particles considered on an absolute temperature scale (in Kelvin). In still further embodiments, $T_{MAX}$ may vary during the sintering process, providing that $T_{MAX}$ (in conjunction with the other process parameters) is sufficient to induce sintering of the metal particles without liquefaction thereof.

The above-described, low temperature sintering process can be carried-out under any process conditions suitable for transforming precursor material 64' into component bond layer 64 and/or conduit bond layer 66. The sintering process may be performed with or without pressure, with or without heating (although some degree of elevated heat will typically be applied), and in any suitable atmosphere (e.g., open air or in the presence of an inert gas, such as nitrogen). A multistage heating schedule can be employed. Additionally, in at least some implementations, a controlled convergent pressure is applied across thermal conduit member 62 and microelectronic component 24 during the sintering process to place the portion of bond layer precursor material 64' forming high κ component bond layer 64 under compression. When applied, the convergent pressure can be delivered as a substantially constant force to distal end 63 of thermal conduit member 62 or, instead, varied in accordance with a time-based or temperature-based schedule. Any suitable mechanism can be utilized to apply the desired convergent pressure including bulk weights, resilient bias devices (e.g., spring-loaded plungers or pins), clamps, hydraulic presses, and the like. The pressure applied may be selected based upon various factors including the desired final layer thickness of high κ component bond layer 64, the desired porosity of layers 64, 66, and the composition of bond layer precursor material 64'.

The sinter bond process thus advantageously forms low stress, mechanically-robust, solid state metallurgical diffusion bonds at the bond joint interfaces, particularly at the joinder interface between microelectronic component 24 and embedded heat dissipation structure 22. When produced pursuant to the above-described metal sintering process, high κ component bond layer 64 and, possibly, conduit bond layer 66 may be predominately composed of one or more sintered metals. Again, the sintered bond layer(s) may or may not contain organic materials. In one embodiment, bond layer 64 and possibly bond layer 66 may consist essentially of one or more metals (e.g., essentially pure Cu or essentially pure Ag) and are essentially free of organic material; that is, contain less than 1 wt % of organic materials. In other embodiments, bond layers 64, 66 may contain resin or other organic fillers. For example, in another implementation, bond layers 64, 66 may contain organic materials that increase pliability, such as an epoxy, to reduce the likelihood of crack formation and propagation across thermal cycles. Depending upon the desired final composition of bond layers 64, 66, the parameters of the sintering process may be controlled to decompose organic materials from bond layer precursor material 64', in whole or in part. Additionally, bond layers 64, 66 may be produced to have a desired porosity, which may range from 0% to 30% by volume in an embodiment. In another embodiment, the sintered bond layer may be formed to have a porosity of less than 1% by volume. Finally, the thickness of high κ component bond layer 64 (i.e., the dimension between thermal conduit member 62 and ground pad 32) will vary amongst embodiments, but may range between about 5 μm and about 100 μm and, preferably, between about 15 μm and about 35 μm in an exemplary and non-limiting embodiment.

In various implementations, the above-described sintering process may also be utilized to form distal bond layer 84 (FIG. 1) concurrently with high κ component bond layer 64 and conduit bond layer 66. In such implementations, bond layer precursor material 64' may be deposited in sufficient volume to outflow from tunnel 42 when thermal conduit member 62 is inserted therein, as generally shown in FIG. 7. Cap piece 88 may be placed in contact with overflow portion 96 of the precursor material, and sintering may be carried-out as previously described to concurrently form bond layers 64, 66, 84 as an integral body of sintered material. In other embodiments, distal bond layer 84 may be formed after sintering from a different material, which is dispensed or otherwise applied onto distal end portion 63 of thermal conduit member 62. Similarly, in still further embodiments, conduit bond layer 66 may not be formed from a sintered material, but rather produced from another material that is backfilled or otherwise introduced into tunnel 42 following the above-described sintering process. For example, and as previously indicated, conduit bond layer 66 may be formed from a solder material in further embodiments, which may be urged to flow into the peripheral space between thermal conduit member 62 and the sidewalls of tunnel 42 by capillary action or using a solder wick material. Afterwards, additional processing steps are performed, as appropriate, to complete fabrication of microelectronic system 20' (FIG. 7) and yield the completed version of system 20 shown in FIGS. 1-2.

There has thus been described an exemplary embodiment of a microelectronic system, which can be fabricated utilizing a relatively straightforward, repeatable, low cost manufacturing process to yield an embedded heat dissipation structure greatly enhancing the thermal performance characteristics of the resultant system. While the above-described exemplary embodiments are believed useful, it is emphasized that the embedded heat dissipation structure can differ in various respects in further embodiments of the microelectronic system. For example, in alternative embodiments, the construction and/or shape of the thermal conduit member can be tailored by design to, for example, enhance the heat spreading functionality of the thermal conduit. Furthermore, while the component bond layer (e.g., high κ component bond layer 64 shown in FIGS. 1-2) is composed of a sintered material in the above-described embodiment, selected non-critical regions of the component bond layer can be replaced with a different type of material, such as solder, in further embodiments. As a still further possibility, alternative embodiments of the microelectronic system can be produced to contain other types of heat-generating microelectronic components, such as bare die and/or microelectronic modules having disparate form factors as compared to that shown in FIG. 1. For example, in yet further embodiments, the microelectronic system may contain a microelectronic module (e.g., a PAM) having a different form factor, such as a leaded form factor. In this regard, embodiments of the microelectronic system can incorporate any number and type of microelectronic components and packages including, but not limited to, PAM packages, quad flat no-lead packages, and gull wing packages implemented utilizing an air cavity or over-molded package body, to list but a few examples. To help further emphasize this point, an additional exemplary embodiment of a microelectronic system including an embedded heat dissipation structure will now be described in conjunction with FIGS. 8-9.

Figure 8:
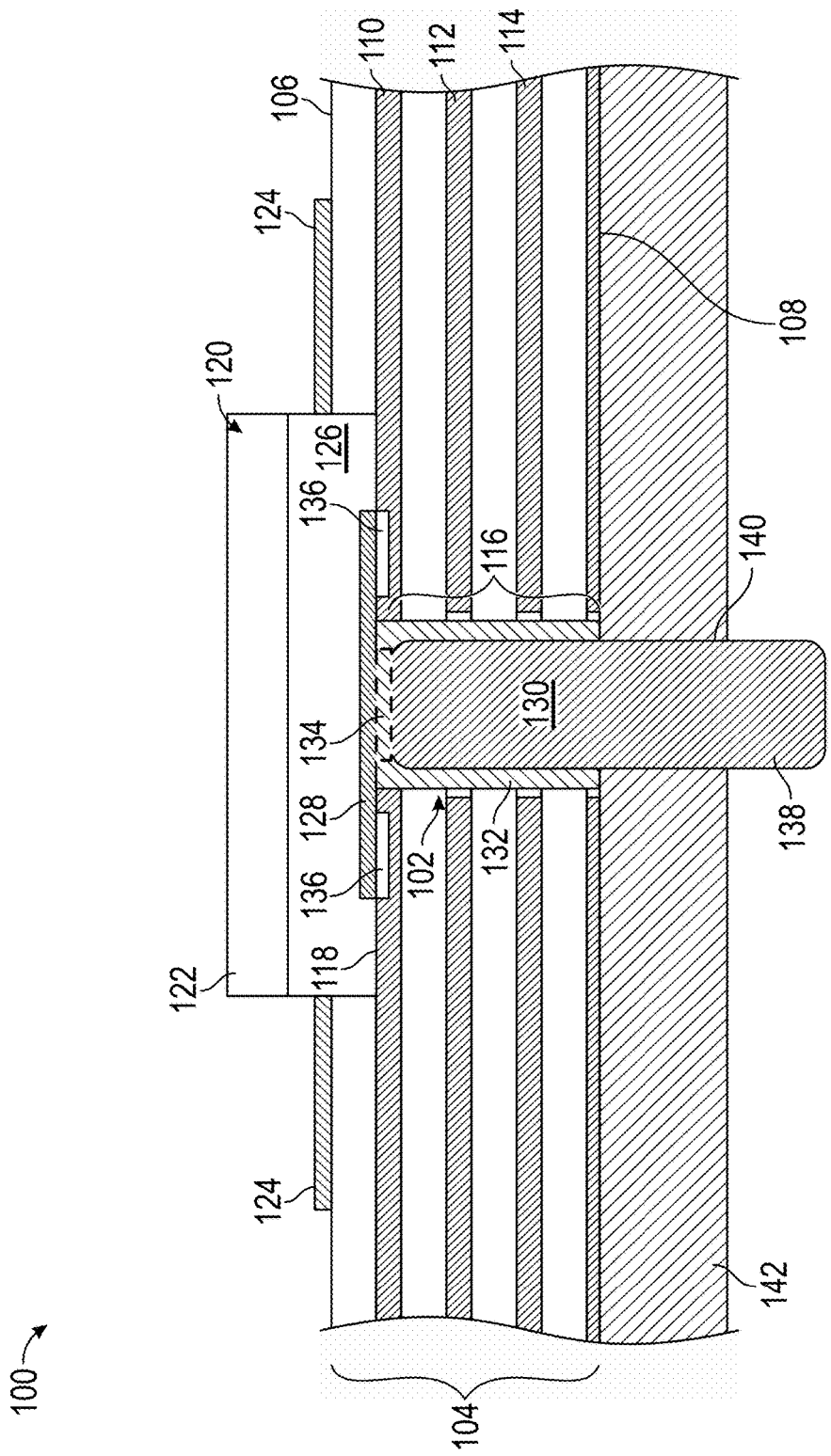
FIG. 8 is cross-sectional view of a microelectronic system including a heat-generating microelectronic component mounted to substrate in which an embedded heat dissipation structure is formed, as illustrated in accordance with a further exemplary embodiment of the present disclosure.
Figure 9:
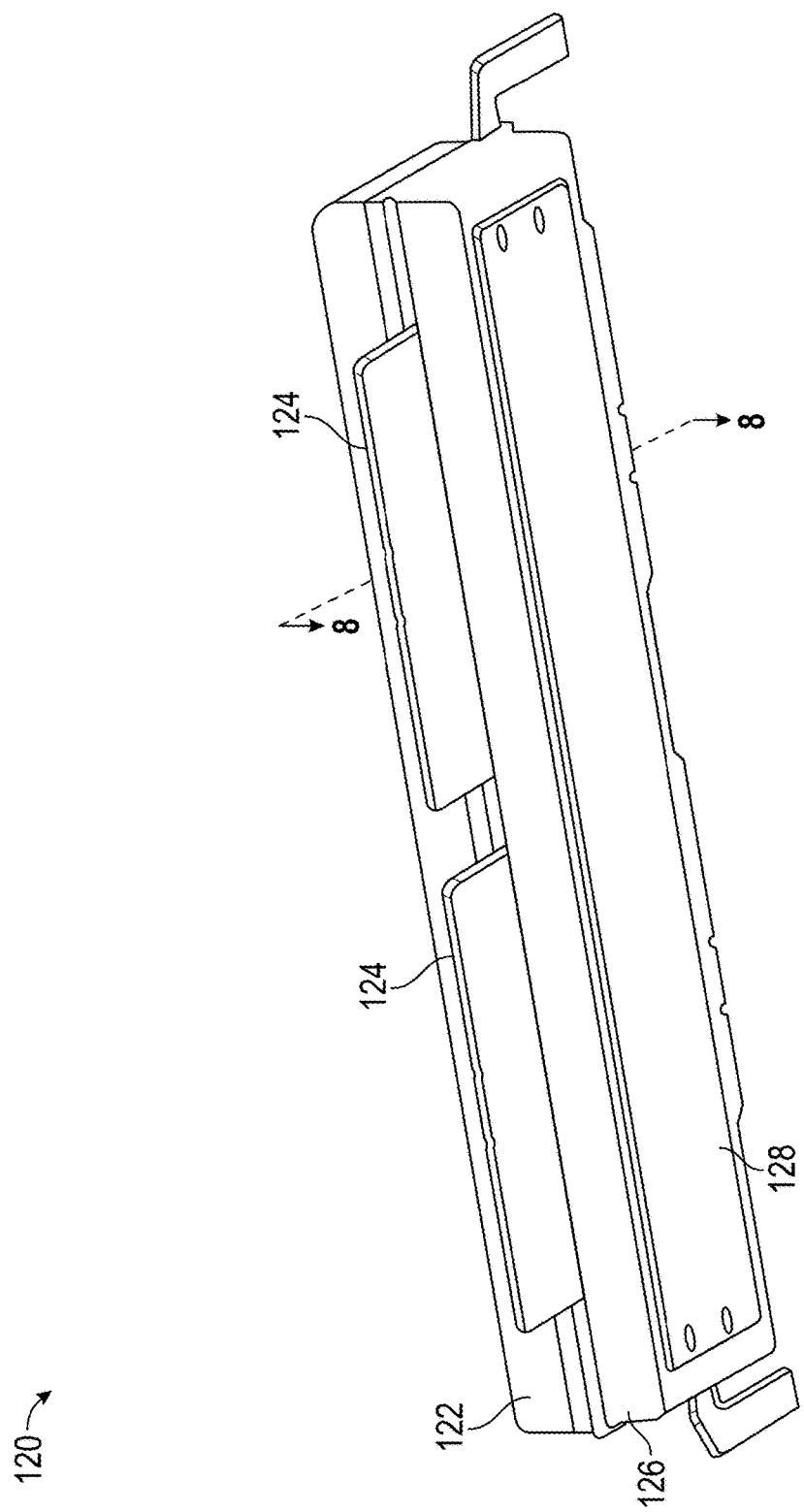
FIG. 9 is an isometric view of the heat-generating microelectronic component shown in FIG. 8, as illustrated in an exemplary implementation in which the microelectronic component assumes the form of a PAM package having a leaded form factor.

Alternative Examples of the Microelectronic System and Embedded Heat Dissipation Structure FIG. 8 is a cross-sectional view of a microelectronic system 100 including an embedded heat dissipation structure 102, as illustrated in according with a further exemplary embodiment of the present disclosure. In many respects, microelectronic system 100 is similar to microelectronic system 20 described above in conjunction with FIGS. 1-7. For example, as does microelectronic system 20, microelectronic system 100 includes a base substrate 104, such as a multilayer PCB, having a frontside 106 and an opposing backside 108. As was previously the case, at least one heat-generating microelectronic component 120 is mounted to frontside 106 substrate 104. Substrate 104 again contains multiple internal wiring layers 110, 112, 114 including an internal ground layer 110, which may be the wiring layer located closest microelectronic component 120. An aperture, through-hole, or tunnel 116 is formed through substrate 104 and extends from substrate backside 108 toward substrate frontside 106. A recess or open cavity 118 is further formed in substrate 104 in this example and is accessible from frontside 106 of substrate 104.

In the exemplary embodiment of FIG. 8, heat-generating microelectronic component 120 assumes the form of a microelectronic package or module, such as a PAM, having a non-surface mount, leaded form factor. Specifically, and referring jointly to FIG. 8 and to FIG. 9 (an isometric view of component 120), microelectronic component 120 may assume the form of a leaded ACM package having a lid or cover piece 122, a plurality of package leads 124, a molded package body 126, and a base flange 128. The bottom principal surface or backside of base flange 128 is exposed through a lower central opening, which is provided in molded package body 126. Flange 128 serves as a terminal or ground pad of component 120 and is consequently referred to hereafter as "ground pad 128." In this manner, ground pad 128 may serve as an electrically-conductive terminal of microelectronic component 120 and, perhaps, as a heatsink or heat spreader. Base flange 128 may thus assume the form of a monolithic metallic structure, plate, or slug in embodiments. In further implementations, heat-generating microelectronic component 120 can assume the form of an over-molded (rather than air cavity) package and/or may possess a different type of leads, such as gull wing leads. Further, ground pad 128 may or may not extend the length of the base of package body 126 in further embodiments depending upon component construction, materials, and package type.

Embedded heat dissipation structure 102 includes a thermal conduit member 130, a thermal conduit bond layer 132, and a high κ component bond layer 134. As was previously the case, the proximal end portion of thermal conduit member 130 is positioned adjacent microelectronic component 120. However, in the embodiment of FIG. 8, distal end portion 138 projects from backside 108 of substrate 104 by a desired distance and may be received within an opening 140 provided within a chassis 142, if and when substrate 104 is mounted thereto. Such a configuration allows thermal conduit member 130 to be lengthened by design and, therefore, may be particularly beneficial when thermal conduit member 130 assumes the form of a heat pipe of the type previously discussed. In certain embodiments, projecting distal end portion 138 of thermal conduit member 130 may be utilized as a fin or similar structure for further promoting convective heat removal from embedded heat dissipation structure 102 and, more generally, from microelectronic system 100. Conduit bond layer 132 extends around thermal conduit member 130 to join or bond member 130 to the sidewalls of substrate 104 defining tunnel 116. Conduit bond layer 132 may substantially fill the peripheral clearance provided between thermal conduit member 130 and the tunnel sidewalls, as generally shown in FIG. 8.

Thermal conduit bond layer 132 and high κ component bond layer 134 may be composed of the same material, similar materials, or dissimilar materials. In various embodiments, conduit bond layer 132 is composed of a first material, such as solder or epoxy; while high κ component bond layer 134 is composed of a second thermally-conductive material having a higher thermal conductivity than the first thermally-conductive material. Specifically, in such embodiments, high κ component bond layer 134 may be composed of a sintered material, such as an Au, Ag, or Cu sintered material of the type previously described. In this manner, the above-described benefits relating to enhanced heat removal and higher temperature tolerances at the central portion of ground pad 128 can be realized to support enhanced thermal performance of microelectronic system 100. Concurrently, the usage of the first thermally-conductively material in forming bond layer 132 may reduce material costs, help simply the manufacturing process, and/or provide other benefits. In such embodiments, the material or materials from which bond layers 132, 134 are formed may or may not be electrically-conductive. Indeed, electrical conduction through bond layers 132, 134 may be unnecessary, particularly as any desired electrical connection between ground pad 128 and ground layer 110 can be completed utilizing (e.g., solder) contacts 136 further shown in FIG. 8.

Thermal conduit member 130 can have various other constructions, shapes, and dispositions in alternative embodiments of microelectronic system 100. For example, in further implementations, thermal conduit member 130 may extend principally in a horizontal direction (that is, in a direction substantially parallel to substrate frontside 106), which may be another useful design approach for increasing the length of conduit member 130 when assuming the form of a heat pipe. Specifically, in one potential realization, thermal conduit member 130 may extend principally in a horizontal direction with the proximal end of conduit member 130 located at or adjacent the cite of component attachment, such as immediately below microelectronic component 120 and separated therefrom by a relatively thin, intervening component bond layer of the type previously described. From the cite of component attachment, thermal conduit member 130 may then extend by a desired distance to conduct heat to another location on substrate 104. For example, this location to which conduit member 130 conducts heat may be horizontally-spaced from microelectronic component 120 and, perhaps, contain a relatively large (e.g., metal) body serving as a heatsink or heat spread. In still further embodiments, it is possible for multiple thermal conduit members to extend from any number of heat-generating microelectronic devices contained in a, for example, a massive MIMO system. In this latter case, the multiple heat pipes may collectively terminate on or adjacent a lateral or peripheral surface of the substrate, which can be placed in contact with a larger (e.g., metal) body; or may instead terminate within a common heatsink or heat spreader, which is mounted to the substrate or perhaps located external thereto.

Conclusion

There has thus been provided microelectronic systems having embedded heat dissipation structures, as well as methods for fabricating such microelectronic systems. Embodiments of the embedded heat dissipation structure usefully contain at least one thermal conduit member, such as a metal body or heat pipe, and one or more (e.g., high κ) component bond layers. The high κ component bond layers can be composed of various different thermally-conductive materials, but are advantageously formed from specialized sintered materials. When utilized, such sintered materials can provide relatively robust metallurgical bonds or joints with regions of the microelectronic component (e.g., a ground pad of a microelectronic package, such as a PAM) and/or with outer surfaces of the thermal conduit member, when present. Further, the resulting sintered bond layers can be produced with little to no voiding, controlled porosities, and highly controlled thicknesses to optimize performance parameters of the microelectronic system. Embodiments of the component bond layer thus allows efficient heat transfer away from the microelectronic component; e.g., in certain embodiments, the component bond layer may provide enhanced heat dissipation from a central portion of a ground pad or terminal included within the component, which tends to reach elevated temperatures more quickly than does the outer peripheral portion of the ground pad to which solder contacts may be bonded. Further, the sintered materials from which the component bond layer is formed may have a relatively high temperature tolerance well exceeding the temperature tolerances provided by commonly-utilized solder materials. The overall heat dissipation capabilities and thermal tolerances of the microelectronic system are enhanced as a result.

The thermal conduit member may be dimensioned to occupy a volumetric majority of the tunnel in embodiments, and may be bonded to the inner sidewalls of the substrate by a conduit bond layer. The conduit bond layer can be formed from a sintered material of the type described above or another material, such as a solder or epoxy. In embodiments in which the conduit bond layer is composed of a sintered material, the conduit bond layer can be formed in conjunction with above-described device bond layer as a single body. For example, in one manufacturing approach, a metal particle-containing precursor material (e.g., a wet state paste) may be dispensed into the tunnel and onto the microelectronic component after component attachment; the thermal conduit member may then be pressed into the metal particle-containing precursor material such that the precursor material flows over and around the thermal conduit; and a low temperature sintering process may then be carried-out to concurrently form the component bond layer and the conduit bond layer. In other implementations, the conduit bond layer may be formed from a non-sintered material, such as an epoxy or solder; or the embedded heat dissipation structure may lack such a thermal conduit member.

In certain embodiments, a method for fabricating a microelectronic system includes the steps or processes of obtaining a substrate having a tunnel formed therethrough, attaching a microelectronic component to a frontside of the substrate at a location covering the tunnel, and producing an embedded heat dissipation structure at least partially within the tunnel after attaching the microelectronic component to the substrate. The step of producing may include application of a precursor material into the tunnel and onto the microelectronic component from a backside of the substrate. The precursor material may then be subjected to a sintering process or otherwise cured to form a thermally-conductive component bond layer in contact with the microelectronic component. In certain embodiments, the microelectronic component may be attached to the frontside of the substrate utilizing a solder material having a first thermal conductivity. In such embodiments, the precursor material may be formulated such that, after curing, the thermally-conductive component bond layer has a second thermal conductivity exceeding the first thermal conductivity. Finally, in certain embodiments, the method may further include the steps or processes of: (i) positioning a thermal conduit member in the tunnel such that, after curing, a proximal end portion of the thermal conduit member is bonded to the microelectronic device through the thermally-conductive component bond layer; and (ii) selecting the thermal conduit member to have a third thermal conductivity substantially equivalent to or exceeding the second conductivity, as taken from the proximal end portion to an opposing distal end portion of the thermal conduit member.

In further embodiments, the microelectronic system fabrication method includes the steps or processes of obtaining a substrate having a frontside, a backside, and internal sidewalls defining a tunnel extending through the substrate. A microelectronic component is then soldered or otherwise attached to the frontside of the substrate at a location overlying the tunnel. An embedded heat dissipation structure is further formed to occupy or substantially fill the tunnel before or after attachment of the microelectronic component. Formation of the embedded heat dissipation structure may entail: (i) application of a metal particle-containing bond layer precursor material into the tunnel; (ii) insertion of a thermal conduit member into the tunnel; and (iii) sintering the metal particle-containing bond layer precursor material to form a thermally-conductive component bond layer bonded to the thermal conduit member. In certain implementations, the step of applying may comprise dispensing a metal particle-containing paste into the tunnel and onto the microelectronic component after attaching the microelectronic component to the frontside of the substrate. Additionally or alternatively, the method may further include the step or process of electrically interconnecting a terminal of the microelectronic component to an electrically-active feature of the microelectronic system through the embedded heat dissipation structure.

Embodiments of a microelectronic system have further been provided. In various embodiments, the microelectronic system includes a substrate having a frontside, a backside opposite the frontside, and a tunnel extending through the substrate. A microelectronic component is attached to the frontside of the substrate at a location overlying the tunnel. An embedded heat dissipation structure is at least partially formed within the tunnel. The embedded heat dissipation structure includes, in turn, a thermal conduit member having a proximal end portion and an outer peripheral surface. The proximal end portion of the thermal conduit member is located within the tunnel and positioned adjacent the microelectronic component. A thermally-conductive component bond layer is formed between the proximal end portion and the microelectronic component, while a conduit bond layer is integrally formed with the thermally-conductive component bond layer and contacts the outer peripheral surface of the thermal conduit member. The thermally-conductive component bond layer and the conduit bond layer can be formed from the same material, such as a solder, thermally-conductive epoxy, or sintered material. In one embodiment, the thermally-conductive component bond layer and the conduit bond layer are composed of a sintered material, such as a material containing or consisting essentially of one or more Au, Ag, or Cu sintered materials. In further embodiments, the microelectronic component may include a terminal, such as a ground pad, electrically coupled to the embedded heat dissipation structure. In such embodiments, the thermally-conductive component bond layer may be bonded to a central portion of the terminal, while the microelectronic system may further include one or more solder contacts bonded to a peripheral portion of the terminal. In yet further implementations, the microelectronic system may include bond layer containment ring, which is located between the microelectronic component and the frontside of the substrate and which peripherally bounds at least a portion of the thermally-conductive component bond layer.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A microelectronic system, comprising:
a substrate having a tunnel therein;
a microelectronic component attached to the substrate at a location enclosing an end of the tunnel;
a solder material attaching the microelectronic component to the substrate, the solder material having a first thermal conductivity; and
an embedded heat dissipation structure at least partially contained within the tunnel, the embedded heat dissipation structure comprising:
a thermally-conductive component bond layer in contact with the microelectronic component and having a second thermal conductivity substantially equivalent to or exceeding the first thermal conductivity;
a thermal conduit member at least partially contained within the tunnel and bonded to the microelectronic component through the thermally-conductive component bond layer; and
a conduit bond layer extending around a periphery of the thermal conduit member and bonding the thermal conduit member to inner sidewalls of the substrate defining the tunnel.

2. The microelectronic system of claim 1 wherein the conduit bond layer and the thermally-conductive component bond layer each comprise sintered metal particles.

3. The microelectronic system of claim 1 wherein the thermal conduit member has a proximal end portion and an opposing distal end portion, the proximal end portion of the thermal conduit member positioned adjacent the microelectronic component.

4. The microelectronic system of claim 3 wherein the substrate comprises a frontside to which the microelectronic component is attached and an opposing backside, and wherein the distal end portion of the thermal conduit member is substantially coplanar with or extends beyond the backside of the substrate in a direction opposing the microelectronic component.

5. The microelectronic system of claim 1 wherein the thermal conduit member occupies at least a majority of the tunnel by volume.

6. The microelectronic system of claim 1 wherein the thermal conduit member comprises:
a proximal end portion;
a distal end portion opposite the proximal end portion; and
a third thermal conductivity substantially equivalent to or exceeding the second conductivity, as taken from the proximal end portion to the distal end portion.

7. The microelectronic system of claim 1 wherein the microelectronic component comprises a terminal; and
wherein the microelectronic system comprises an electrically-active feature electrically interconnected with the terminal of the microelectronic component through the embedded heat dissipation structure.

8. A microelectronic system, comprising:
a substrate having a tunnel therein;
a microelectronic component attached to the substrate at a location enclosing an end of the tunnel;
a solder material attaching the microelectronic component to the substrate, the solder material having a first thermal conductivity;
an embedded heat dissipation structure at least partially contained within the tunnel, the embedded heat dissipation structure comprising a thermally-conductive component bond layer in contact with the microelectronic component and having a second thermal conductivity substantially equivalent to or exceeding the first thermal conductivity; and
a bond layer containment ring between the microelectronic device and the tunnel, the bond layer containment ring extending at least partially around the thermally-conductive component bond layer.

9. The microelectronic system of claim 8 wherein the embedded heat dissipation structure further comprises a thermal conduit member at least partially contained within the tunnel and bonded to the microelectronic component through the thermally-conductive component bond layer.

10. The microelectronic system of claim 9 wherein the thermal conduit member has a proximal end portion and an opposing distal end portion, the proximal end portion of the thermal conduit member positioned adjacent the microelectronic component.

11. The microelectronic system of claim 10 wherein the substrate comprises a frontside to which the microelectronic component is attached and an opposing backside, and wherein the distal end portion of the thermal conduit member is substantially coplanar with or extends beyond the backside of the substrate in a direction opposing the microelectronic component.

12. The microelectronic system of claim 9 wherein the thermal conduit member occupies at least a majority of the tunnel by volume.

13. The microelectronic system of claim 9 wherein the thermal conduit member comprises:
a proximal end portion;
a distal end portion opposite the proximal end portion; and
a third thermal conductivity substantially equivalent to or exceeding the second conductivity, as taken from the proximal end portion to the distal end portion.

14. The microelectronic system of claim 8 wherein the microelectronic component comprises a terminal; and
wherein the microelectronic system comprises an electrically-active feature electrically interconnected with the terminal of the microelectronic component through the embedded heat dissipation structure.

15. The microelectronic system of claim 8 wherein the bond layer containment ring is composed of a material having a thermal conductivity less than the second thermal conductivity.

16. A microelectronic system, comprising:
a substrate having a frontside, a backside opposite the frontside, and a tunnel extending through the substrate;
a microelectronic component attached to the frontside of the substrate at a location overlying the tunnel; and
an embedded heat dissipation structure at least partially formed within the tunnel, the embedded heat dissipation structure comprising:
a thermal conduit member having a proximal end portion and an outer peripheral surface, the proximal end portion of the thermal conduit member located within the tunnel and positioned adjacent the microelectronic component;
a thermally-conductive component bond layer formed between the proximal end portion of the thermal conduit member and the microelectronic component; and
a conduit bond layer integrally formed with the thermally-conductive component bond layer and contacting the outer peripheral surface of the thermal conduit member.

17. The microelectronic system of claim 16 wherein the microelectronic component comprises a terminal electrically coupled to the embedded heat dissipation structure, the terminal having a central portion contacted by the thermally-conductive component bond layer.

18. The microelectronic system of claim 17 further comprising solder contacts bonded to a peripheral portion of the terminal.

19. The microelectronic system of claim 16 wherein the substrate contains a ground layer; and
wherein the microelectronic component comprises a ground pad electrically coupled to the ground layer through the embedded heat dissipation structure.

20. The microelectronic system of claim 16 wherein the thermal conduit member further comprises a distal end portion opposite the proximal end portion; and
wherein the microelectronic system further comprises a heat spreader cap piece bonded to the distal end portion of the thermal conduit member.

* * * * *